Figure 1:
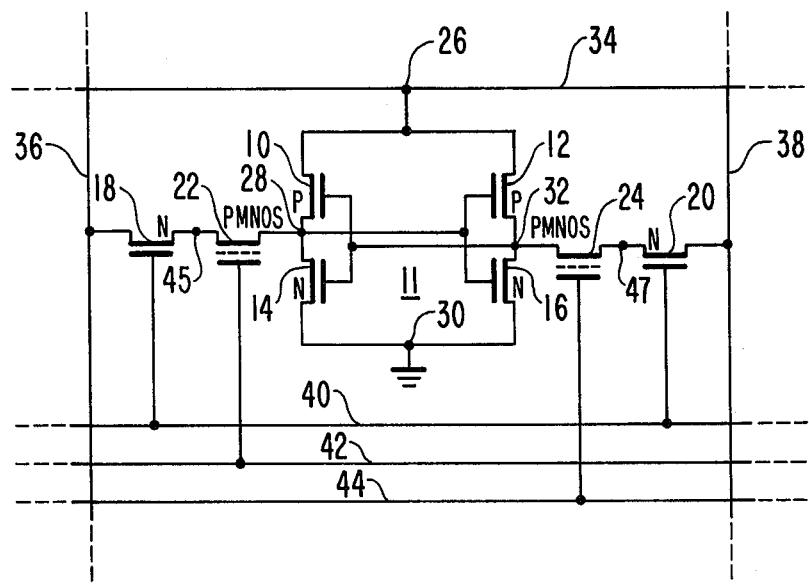

United States Patent [19]
Denes

[11] 4,095,281
[45] June 13, 1978

[54] RANDOM ACCESS-ERASABLE READ ONLY MEMORY CELL

[75] Inventor: George Denes, Austin, Tex.

[73] Assignee: RCA Corporation, New York, N.Y.

[21] Appl. No.: 663,752

[22] Filed: Mar. 4, 1976

[51] Int. Cl.² ............... G11C 11/40; G11C 17/00
[52] U.S. Cl. ................................. 365/156; 307/279; 365/184
[58] Field of Search ............ 340/173 FF, 173 R; 307/279, 291

[56] References Cited
U.S. PATENT DOCUMENTS

| | | | |
|---|---|---|---|
| 3,493,786 | 2/1970 | Ahrens et al. | 307/279 |
| 3,636,530 | 1/1972 | Mark et al. | 340/173 FF |
| 3,662,351 | 5/1972 | Ho et al. | 340/173 FF |
| 3,990,056 | 11/1976 | Luisi et al. | 340/173 R |

OTHER PUBLICATIONS

Frohman et al., Metal-Nitride-Oxide-Silicon-Transistor, Proceedings of the IEEE, 8/70, pp. 1218-1219.

*Primary Examiner*—Stuart N. Hecker
*Attorney, Agent, or Firm*—H. Christoffersen; Allen LeRoy Limberg; Samuel Cohen

[57] ABSTRACT

Transistor memory cells which may be operated in both the erasable "read only" and the "random access" modes. Each cell includes a plurality of MOS transistors interconnected to permit random access storage and at least two MNOS transistors. The latter may be set, one to one threshold level and the other to a second threshold level to represent read only storage of a logic 1, and the threshold levels may be reversed to represent read only storage of a logic 0. The MOS transistors may be randomly accessed both for read and write independently of what the MNOS transistors are storing.

4 Claims, 2 Drawing Figures

RANDOM ACCESS-ERASABLE READ ONLY MEMORY CELL

Circuits requiring both the read only memory (ROM) and the random access memory (RAM) functions are widely used. For example, microcomputers and calculators often utilize ROMs to provide start-up programs, storage of fixed computation routines or data tables while a RAM is utilized for temporary storage of data and addresses. In certain of such circuits the memory is of limited capacity and only a small amount of space is available for the electronic circuitry associated with the memory. In these, it would be advantageous if the two memories could be replaced by a single memory in which the cells could operate in both the RAM and ROM modes. The memory would then require a smaller number of address lines. In addition, a system employing a single memory would require fewer circuits in that only a single address decoder, sense amplifier and so on would be needed rather than the two needed for systems employing separate ROM and RAM memories.

Figure 2:
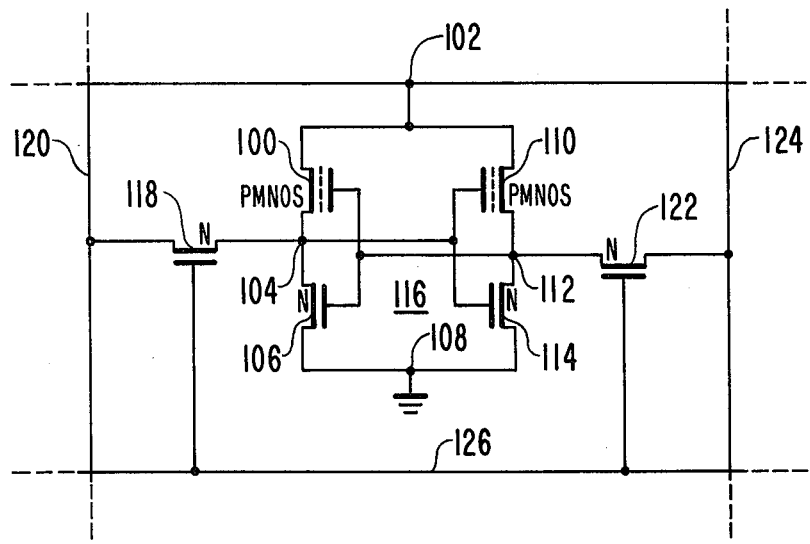

In the drawings:

FIG. 1 is a schematic circuit diagram of a first embodiment of the invention; and FIG. 2 is a schematic circuit diagram of an additional embodiment of the invention.

The transistors used in the circuits described herein are conductor-insulator-semiconductor (CIS) devices. The conductor may be metal and the insulator may be an oxide. In FIG. 1 transistors 10 and 12 are P type metal-oxide-semiconductor (PMOS) transistors while transistors 14, 16, 18 and 20 are N type metal-oxide-semiconductor (NMOS) devices. Transistors 22 and 24 are P type variable threshold metal-nitride-oxide-semiconductor (PMNOS) devices. The conduction path of transistor 10 is connected between node 26, to which a supply voltage may be applied via line 34, and cell input node 28. The conduction path of transistor 14 is connected between node 28 and node 30 which node is in turn connected to a reference potential, herein ground. The conduction path of transistor 12 is connected between node 26 and cell input node 32 while the conduction path of transistor 16 is connected between nodes 32 and 30. The interconnected gate electrodes of transistors 12 and 16 are connected to node 28 while the interconnected gate electrodes of transistors 10 and 14 are connected to node 32.

The conduction paths of transistors 18 and 22 are serially connected between digit line 36 and node 28. The conduction paths of transistors 24 and 20 are serially connected between node 32 and digit line 38. The gate electrodes of transistors 18 and 20 are connected to control line 40 while the gate electrodes of transistors 22 and 24 are connected to control lines 42 and 44, respectively. Transistors 10 and 14 comprise a first inverter while transistors 12 and 16 form a second inverter. The cross-coupled connection of these inverters comprises bistable circuit 11.

The circuit of FIG. 1 can function as a RAM or as an electrically alterable read only memory (EAROM) depending on the levels of the operating and control voltages. In addition, the ROM function is non-volatile. That is, in the event that circuit power is lost or switched off, the ROM information contained therein is not destroyed.

The ROM information is stored in PMNOS transistors 22 and 24. These devices are variable threshold field effect transistors in which the gate insulator is a composite structure of two insulating layers. The layer closest to the silicon substrate may be silicon dioxide while the top layer may be silicon nitride. Carrier traps exist at or near the interface between the two insulating layers. These traps are charged and discharged by an electric field across the insulating layer region which is set up by the application of sufficiently large voltages of suitable polarity to the transistor's electrodes. Such a field may be established across the gate-substrate or gate-conduction path regions. The charge states of the traps influence the silicon surface potential and therefore can change the threshold voltage of the MNOS transistor.

The threshold voltages are relatively stable and electrically alterable. A multiplicity of threshold values may be realized by varying either the value of the applied voltages or the length of time during which the voltage is present, or both.

To assist in the explanation of the operation of the circuit of FIG. 1, typical values are assigned to the circuit voltages. It is to be understood that these are examples only. The operation of the memory cell in its RAM mode will first be considered. When operated as a RAM cell, transistors 18, 20, 22 and 24 function as access devices, connecting digit lines 36 and 38 to the input nodes of the cell. For RAM operation, the amplitude of the operating and control voltages is small enough not to disturb the threshold settings of transistors 22 and 24.

When it is desired to write RAM information into the cell, the voltages on the digit lines 36 and 38 are set to predetermined values. For example, the voltage on line 36 may equal +10 volts and the voltage on line 38 may equal zero volts. At the same time, the cell operating voltage as measured at node 26 also may equal +10 volts. When it is desired to transfer the information contained on the digit lines to bistable 11, transistors 18, 22, 24 and 20 are turned on. Transistors 18 and 20 are turned on by the application of a positive voltage to control line 40. This voltage may be, for example, +10 volts. Transistors 22 and 24 are turned on by the application of a control voltage that is sufficiently negative with respect to their source electrodes to control lines 42 and 44, respectively. This voltage may be, by way of example, zero volts. If nodes 28 and 32 are not already at the same potentials as lines 36 and 38, respectively, the turning on of the access transistors causes this to occur and bistable 11 then switches to the desired state. In other words, the +10 volts at node 28 turns on transistor 16 and turns off transistor 12 and the zero volts at node 32 turns on transistor 10 and turns off transistor 14, so that the nodes 28 and 32 remain stable, at values of +10 volts and 0 volts, respectively. After allowing an adequate amount of time for the transition to take place, the access transistors are turned off.

To sense the state of the RAM cell, the access transistors 18, 22, 24 and 20 are once more concurrently turned on, thereby coupling the voltages present at nodes 28 and 32 of the cell to digit lines 36 to 38, respectively. Sensing circuits (not shown) connected to the digit lines sense these voltages. If desired to speed up the read operation, prior to the initiation of the read operation, both digit lines may be precharged to a particular voltage, for example, +10 volts. Precharging is an operation whereby a voltage is applied to the digit lines for a time sufficient to permit the stray capacitance associated with each line to charge to the level of the applied voltage. After this charging, the precharge voltage is removed.

The non-volatile EAROM function will now be considered. First, consider the write operation for the ROM cell. Before writing data into the cell, it is cleared by biasing both PMNOS devices to the more positive threshold level as measured with respect to the source electrode of each device. In the present example, this voltage is −2 volts. To clear the cell, the voltage at node 26 as well as the voltages on digit lines 36 and 38 is made equal to zero. The voltage on lines 40, 42 and 44 is made equal to $V_W$, where $V_W$ is a voltage having a value of from 20 to 25 volts. The voltage $V_W$ turns on transistors 18 and 20 placing nodes 45 and 47 at zero volts. If node 28 was at zero volts before anode 26 was placed at zero volts, it remains there. If node 32 initially was at +10 volts, while node 26 is going toward zero, transistor 12 remains conducting so that node 36 goes toward zero volts, reaching a value close to zero volts before transistor 12 turns off. If the cell initially were in its other state, the result would be similar. In both cases, nodes 28 and 32 would be at zero volts or close to it. Under these conditions, that is, both ends of the conduction path of transistors 22 and 24 at zero volts or close to it and a large positive voltage +$V_W$ applied to the gate electrodes of these transistors, the required electric field is produced from the gate electrode to the conduction channel of transistors 22 and 24 to set these transistors to the desired threshold level of −2 volts. That is the transistors 22 and 24 now require a gate-to-source voltage of −2 volts to conduct.

Assume now that it is desired that a ROM logical one be written into the cell. This is arbitrarily defined as the condition when PMNOS transistor 22 is set to its less positive threshold level, in the present example −6 volts, and PMNOS transistor 24 is set to its more positive level (−2 volts). To write this bit of information, the voltages at node 26, digit line 36 and control lines 40 and 44 are all made equal to $V_W$ while the voltages on digit lines 38 and control line 42 are made equal to zero. For these voltages, transistor 18 is on, coupling the $V_W$ voltage present on line 36 to node 45. Transistor 22 is turned on by the zero volts applied to control line 42, thereby applying the voltage $V_W$ to node 28 of the cell. This turns on transistor 16 and turns off transistor 12 thereby turning on transistor 10 and turning off transistor 14. As a result, the cell 11 is in a state in which node 28 is at $V_W$ and node 32 is at zero volts. Transistor 20 is turned on by the signal applied to control line 40, coupling the zero volt signal present on digit line 38 to node 47. Transistor 24 is held off by the $V_W$ voltage on control line 44. Thus, both ends of the conduction path of transistor 22 are at the voltage $V_W$ while both ends of the conduction path of transistor 24 are at zero volts. The $V_W$ voltage at the gate electrode of transistor 24 therefore causes transistor 24 to retain its more positive threshold level of −2 volts. On the other hand the field in the reverse direction through transistor 22 (+$V_W$ at its source and drain electrodes and zero volts at its gate electrode, sets transistor 22 to its more negative threshold level which is −6 volts in this example.)

A ROM read operation whereby the ROM data is recalled from the cell consists of the following steps:

first, the cell has its RAM information discharged. The ROM data, as determined by the information content of transistors 22 and 24, is transferred to bistable 11, setting it to a particular state. The state of the cell is then determined by means similar to that described for the RAM read operation. It should be noted that the ROM RAM read operation destroys the RAM information content of the cell. This is generally no problem in practical applications because there is usually no need for the temporary (RAM) data at the time of the permanent (ROM) data read out. The transfer of information from transistors 22 and 24 to the bistable circuit does not destroy the information stored by these transistors. In other words it is a non-destructive ROM read out process.

To discharge the RAM information from the cell, the voltage at node 26, digit lines 36 and 38, and control line 40, is set to zero. The voltage at control lines 42 and 44 may be, for example, 10 volts. By having the supply voltage node 26 at zero and no conduction path through devices 22 and 24, cell nodes 28 and 32 both discharge to the zero volt level in the manner already discussed. The ROM information may now be written into the cell.

Prior to the restoration of power at node 26, digit lines 36 to 38 are both connected to a positive voltage, for example, 10 volts. An operating voltage is concurrently applied at node 26. This voltage may also equal 10 volts. After the above voltages have been applied, the access devices are concurrently turned on. With all access devices conducting, nodes 28 and 32 begin to charge towards the voltage present on the digit lines. The charging rate is determined by the relative degree of conduction of transistors 22 and 24. The device having the more positive threshold level, in this case transistor 24, has a higher conductivity than transistor 22 which is set to the more negative level. As a result, node 32 is charged faster than node 28. The access devices are turned off before both nodes are fully charged, thereby maintaining the difference of potential between nodes 28 and 32, which difference causes the cell 11 to assume the desired state. In the present example the voltage at node 32 approaches the value of the voltage present at node 26 while the voltage at node 28 is driven to the reference potential level. As mentioned earlier, the information content of the cell may now be sensed in the same manner as that used for the RAM read operation.

FIG. 2 shows a second embodiment of the invention. This circuit differs from the FIG. 1 circuit in that transistors 100 and 110, which replace transistors 10 and 12, are variable threshold PNMOS devices rather than PMOS devices, and transistors 22 and 24 of FIG. 1 are absent from the circuit of FIG. 2. In addition, the control voltage lines corresponding to 42 and 44 are absent. Transistors 100, 106, 110 and 114 comprise bistable circuit 116.

The circuit of FIG. 2 may function in either the RAM or EAROM modes of operation. As in the case of FIG. 1, the specific values of operating voltages given are intended as examples only. In the operation of the circuit, operating and control voltages in the zero or +10 volt range may be utilized for the RAM function. The circuit functions in both the read and write modes in a manner similar to the conventional RAM six transistor CMOS memory cell known in the prior art. The operation of such a cell is described, for example, in U.S. Pat. No. 3,521,242.

For the ROM mode of operation, the read function will first be considered. Assume that transistor 100 initially is set to a more positive threshold voltage level, for example, −2 volts, and transistor 110 is set to a less positive threshold voltage level, for example, −6 volts. (The way this can be accomplished is discussed later). The operating voltage at node 102 is set to zero volts, thereby clearing bistable 116, that is, thereby placing nodes 104 and 112 at the reference potential level (zero volts). The distributed capacitance of digit lines 120 and 124 is predischarged to the reference potential level, by, for example, momentarily connecting these lines to ground. A voltage of +10 volts is now supplied to node 102, and access transistors 118 and 122 are turned on by applying a positive control voltage such as +10 volts to line 126. This couples input nodes 104 and 112 to digit lines 120 and 124, respectively. The voltage at these nodes (zero volts) tends to turn on transistors 100 and 110 and turn off transistors 106 and 114. Each PMNOS transistor supplies a current to charge the distributed capacitance associated with each digit line. Because of the threshold levels, transistor 100 has a higher conductivity than transistor 110. This means that the potential at node 104 is rising faster than that at node 112. Transistors 118 and 122 are turned off before nodes 104 and 112 are fully charged, resulting in a potential difference between these nodes. This difference causes bistable 116 to assume a state where the voltage at node 104 is near the operating potential and the voltage at node 112 is near the reference potential. The ROM information has been transferred from PNMOS transistors 100 and 110 to bistable 116 in a non-destructive manner. The state of the cell may now be sensed in a conventional manner through access transistors 118 and 122.

The write ROM data function will now be considered. The threshold levels of transistors 100 and 110 will be reversed. That is, the threshold level of transistor 110 will be changed from −6 to −2 volts while the threshold level of transistor 100 is changed from −2 to −6 volts.

To write the desired information, the voltage at node 102 as well as the voltage on line 120 is raised to a level such as +25 volts while the voltage on line 124 is placed at zero volts. Access transistors 118 and 122 are then turned on. As a result, 25 volts is applied to the gate of transistor 110 and zero volts is applied to the gate of transistor 100. The resulting gate to conduction path fields in the respective devices causes them to assume the desired threshold values. That is, the negative field in transistor 100 results in a more negative threshold while the positive field in transistor 110 sets the latter device to a more positive threshold. After a sufficient amount of time has elapsed for these values to be reached, transistors 118 and 122 are switched off, thereby completing the write operation.

The circuits of FIGS. 1 and 2 each may represent one element in a memory array where said array has $m$ rows of such elements and $n$ columns, resulting in a total of $m$ times $n$ cells for the array. In such an array, the digit lines may be common to all cells in a column while the operating voltage and address control lines may be common to all cells in a given row.

In the above circuits, it was assumed that the substrate of each MNOS transistor was connected to its associated source electrode. An alternative approach is to connect the substrate of each transistor to a "substrate write" line whereby the electric fields required for a ROM write operation may be obtained by selection of the appropriate gate and "substrate write" line voltages.

In the circuits of FIGS. 1 and 2, the PMNOS transistors may be replaced by other devices having similar electrically alterable high and low threshold voltages such as floating gate MOS transistors. In addition, each transistor may be replaced with one having the opposite conductivity if the circuit voltages are suitably modified. While the embodiments have used metal gate transistors, it should be appreciated that non-metallic insulated gate transistors may be used where the gate material is, for example, polysilicon.

What is claimed is:

1. In a memory of the kind selectively operable in RAM and ROM modes, said memory comprising first and second inverters, each inverter having an output node cross-coupled to an input node of the other for forming a static RAM cell, the output node of each inverter of said RAM cell being selectively connected via the conduction paths of separate access transistors to respective digit lines, the control electrodes of said access transistors being connected to a common control line and each inverter including at least a first field effect transistor having an unbalanced impedance means associated therewith for providing ROM data retention, the improvement for providing RAM and EAROM operation of said memory, characterized in that:

said unbalanced impedance means comprises a first variable-threshold transistor connected as a load in the drain circuit of said first field effect transistor in said first inverter and having a control electrode connected to the output of said second inverter; and a second variable threshold transistor connected as a load in the drain circuit of said first field effect transistor in said second inverter and having a control electrode connected to the output of the first inverter.

2. A memory as recited in claim 1 wherein:

the source electrodes of said field effect transistors are connected to a point of reference potential; wherein the variable-threshold transistors comprise a pair of MNOS transistors connected at the drain electrodes thereof to respective drain electrodes of said field effect transistors and connected at the source electrodes thereof to an operating voltage node; and wherein means are provided for changing the voltage at said operating voltage node between a first value substantially equal to the potential at said point of reference potential and a second predetermined value in an EAROM read mode of operation.

3. A memory as recited in claim 2 further comprising:

means for applying a potential greater than said predetermined value to a selected one of said output nodes and to said operating voltage node during a EAROM write operation.

4. A memory cell comprising, in combination:

first and second digit lines;

a terminal for an operating voltage;

a first inverter comprising a conductor-insulator-semiconductor (CIS) transistor of a first conductivity type and a variable threshold transistor of a second conductivity type, each transistor having a conduction path and a control electrode, said control electrodes interconnected and said variable threshold transistor conduction path connected between said terminal and a first node and said CIS transistor conduction path connected between said first node and a point of reference potential;

a second inverter comprising a second CIS transistor of said first conductivity type and a second variable threshold transistor of said second conductivity type, each transistor having a conduction path and a control electrode, said second CIS and said second variable threshold transistors control electrodes interconnected and connected in turn to said first node, said second variable threshold transistor conduction path connected between said terminal and a second node, said second CIS transistor connected between said second node and said point of reference potential and said second node connected to said first CIS transistor control electrode;

first switch means for connecting said first digit line to said first node;

second switch means for connecting said second digit line to said second node; and means for concurrently operating both switch means.

* * * * *